United States Patent Office 3,060,024

Patented Oct. 23, 1962

3,060,024

PHOTOPOLYMERIZATION PROCESS FOR REPRODUCING IMAGES

Marion Burg, Metuchen, and Abraham Bernard Cohen, Springfield, N.J., assignors to E. I. du Pont de Nemours and Company, Wilmington, Del., a corporation of Delaware No Drawing. Filed Sept. 11, 1959, Ser. No. 839,304
20 Claims. (Cl. 96—28)

This invention relates to a thermal process for transferring an image embodying finely divided solid particles from a photopolymerizable image-bearing layer. More particularly, it relates to such a process which uses heat rather than aqueous solutions. Still more particularly, the invention relates to a process which involves dusting of a heated, exposed surface of a photopolymerizable image-bearing layer with finely divided particles and transferring the particles and photopolymerizable materials in the image-bearing areas to a separate support.

Copying processes involving the use of dusting on of pigments or other materials onto image-containing surfaces are well known in the art. The known dusting processes, however, have one or more of the following disadvantages, e.g., they involve the use of an image which is tacky at room temperature, thereby requiring special handling of the unexposed film and fixing after development; solvents or other liquids are used to make the substances tacky when tackiness is required; and they have poor shelf life and require long exposure times.

An object of this invention is to provide a simple and practical process for reproducing images from elements containing an image in the form of a photopolymerizable layer. Another object is to provide such a process which embodies a dry heat transfer step. Yet another object is to provide such a process which reproduces said image with finely divided discrete solid particles. A further object is to provide such a process which does not require aqueous or solvent treating solutions. A still further object is to provide such a process which utilizes inexpensive apparatus and commercially available, finely divided material, e.g., dyes and pigments. Still further objects will be apparent from the following description of the invention.

The novel and useful image reproduction process of this invention in its broader aspects comprises (A) applying finely divided discrete particles of material solid at the temperature at which the particles are transferred to the surface of a layer containing a thermoplastic image in said surface, said layer being solid below 40° C. and containing (1) tacky image areas (underexposed) which are thermally transferable by having a transfer (or stick) temperature above 40° C. and below 220° C. comprising (*a*) a thermoplastic organic polymer solid at 50° C. and (*b*) an ethylenically unsaturated compound containing at least one terminal ethylenic ($CH_2=C<$) group, having a boiling point above 100° C. at normal atmospheric pressure, being capable of forming a high polymer by photoinitiated addition polymerization and having a plasticizing action on said thermoplastic polymer; said constituents (*a*) and (*b*) being present in amounts from 3 to 97 and 97 to 3 parts by weight, respectively, and (2) complementary adjoining coplanar non-tacky image areas (i.e., exposed reverse image areas) solid at 50° C. and comprising an addition polymer of an aforesaid unsaturated compound and said thermoplastic polymer, (B) removing the particles in said complementary areas, and (C) contacting the surface of the layer having the finely divided particles adherent to the tacky areas with the image receptive surface of a separate element while maintaining said layer at a transfer temperature of at least 40° C. and separating the latter element from said layer whereby said particles and an adherent portion of the thermally transferable underexposed image areas transfer to the surface of the image-receptive element.

In the foregoing process, the layer containing the ethylenically unsaturated compound may, in addition to constituents (*a*) and (*b*), contain (*c*) an addition polymerization initiator activatable by actinic light and thermally inactive below 185° C. in an amount from 0.001 to 10 parts by weight and, if desired, (*d*) an addition polymerization inhibitor in an amount from 0.001 to 2.0 parts by weight.

The term "underexposed" as used herein is intended to cover the image areas which are completely unexposed or partially exposed so that there is a material amount of the addition polymerizable compound still present and insufficient addition polymer image has been formed to bind the constituents so that the image areas will not adhere to solid particles at a tack temperature or be non-thermally transferable at a stick or transfer temperature at which the underexposed areas are thermally transferable to the image-receptive element. The term "transfer temperature" means the temperature at which the image areas in question stick or adhere, within 10 seconds, under slight pressure, e.g., thumb pressure, to analytical filter paper (Schleicher & Schuell analytical filter paper #595).

In general, in the process, components (*a*) and (*b*) are present in amounts from 10 to 95 and 5 to 90 parts by weight, respectively, based on the weight of the polymer and monomer. Also, the compositions are such that they do not melt at temperatures below 40° C. and are not thermally polymerizable within 0.5 second at temperatures below the melting point of the composition.

The foregoing thermoplastic image-bearing elements can be made by exposing to actinic light, imagewise, a layer having the constitution defined above for the thermally transferable image areas of item (1) above until substantial addition polymerization takes place in the exposed areas to form an addition polymer and no significant polymerization takes place in the underexposed areas. The exposure can be through a line or halftone negative or positive, or a stencil in contact with the layer or by reflectographic or projection exposure.

While the addition polymerizable component present in the underexposed areas of the photopolymerizable element can be a monomeric ethylenically unsaturated compound capable of polymerizing or forming a high polymer in a short time, e.g., 0.5–10 seconds, by photoinitiated polymerization as disclosed in Plambeck U.S. 2,760,863, the particularly useful compounds fall within a general class, namely, normally non-gaseous (i.e., at 20° C. and atmospheric pressure) ethylenically unsaturated monomeric compounds having at least one terminal ethylenic group, preferably two, a molecular weight of not more than 1500, a normal boiling point above 100° C., and a plasticizing action on the thermoplastic polymer.

In practicing the invention, a photopolymerizable element having an image-yielding layer containing the above components is exposed to actinic radiation through a stencil, a photographic process transparency, e.g., a photographic positive, negative, two-tone or halftone, a light-transmitting paper, or to an image or printed matter on an opaque support by means of reflex exposure, and after applying the finely divided particles, e.g., by dusting onto the layer heated to the tack temperature. The particles are removed in the exposed (polymerized) image areas and intimately brought into contact under pressure with a receptor support, e.g., paper, metal, synthetic polymer, screen, etc., during which time the element is heated in the range of 40° to 220° C. or more, i.e., to the transfer temperature, and while still warm the surfaces are separated. The particles and a portion of the thermoplastic photopolymerizable composition adherent to the particles are transferred to the paper, metal, etc. support in the areas corresponding to the unexposed, or least exposed, areas to give at least one duplicate copy of the original positive, negative or original image. Multiple copies can be obtained by repeating the heat transfer procedure and the dusting step using appropriate coating thicknesses of the photosensitive layer, pressures and temperatures to give the desired number of copies.

In applying the finely divided solid material to the layer, the surface of the latter while plastic or tacky can be dusted with finely divided solid materials, e.g., pigments, powders, dyes, thermographic materials and color formers, forming an image on the surface of the photopolymerized composition in the areas which have not been exposed to the actinic light. These particles preferably are inert and do not react with the constituents in the layer. The dusted element can be used to make a single copy or under certain conditions several copies of the original image transparency can be made by contacting the dusted surface with a receptor surface and applying heat. In various embodiments of the invention illustrated below, dyes and pigments can be dusted on the photopolymerized composition surface (see Examples I, II, IV, V and for reflex Exposure IX); metallic powders, e.g., copper, can be dusted on and the surface electroplated to form printed circuits (see Example III); color forming constituents can be used which form colored compounds when heat is applied (see Example VI thermographic) or when brought into contact with other color forming components (see Example VIII); printing plates can be made, e.g., lithographic (see Example VII), relief (see Example XII); multicolor reproductions of the original image can be made (see Example XI); multiple copies of the transferred image can be made by a wet process, i.e., spirit copying (see Example X).

In exemplification of the invention, a photopolymerizable composition comprising (*a*) A thermoplastic polymer, e.g., polyethylene terephthalate/sebacate;

(*b*) An addition polymerizable ethylenically unsaturated compound, e.g., polyalkylene glycol diacrylate;

(*c*) An addition polymerization initiator, e.g., anthraquinone, preferably 0.1 percent by weight based on the weight of the ethylenically unsaturated compound and (*d*) A thermal polymerization inhibitor, e.g., p-methoxyphenol, preferably 0.1 percent by weight based on the weight of the ethylenically unsaturated compound, is coated to a dry thickness of 0.1 to 10 mils (the preferred thickness depends on its particular application, e.g., the lower limits are suitable to make offset printing plates or for office copying and the upper limits are suitable for making multiple copies as well as for making relief images) on a base support, preferably a polyethylene terephthalate film base support, said photopolymerizable composition, when dry, is exposed to actinic light through a photographic process transparency, e.g., a photographic positive, negative, which may be two tone or halftone, by means of a stencil, or by reflex exposure. The exposed layer is heated, e.g., by means of a hot surface for 0.1 to 5 seconds at a temperature range of 40° C. to 170° C. (the temperature varies depending on the photopolymerizable composition used) and is sprinkled or dusted with fine particles of dyes, pigments, e.g., phosphors, carbon, graphite, metal powders, e.g., aluminum, copper, etc. so that the surface is covered. The element is cooled and the excess dye, pigment, etc. is removed, e.g., by brushing or blowing techniques. The dye, pigment, etc. remains in the areas of the photopolymerized layer which were underexposed to actinic light, forming an image. At least one copy of the original transparency can be made if the dusted image is brought into intimate contact with a receptor surface, preferably paper, and the sandwich formed is heated to about 50 to 170° C.

The alkylene or polyalkylene glycol diacrylate can be prepared by the esterification of a glycol, e.g., an alkylene glycol of 2 to 15 carbon atoms or polyalkylene ether glycol of 1 to 10 ether linkages with acrylic acid, the water formed being continuously removed. The other raw materials used in this invention are available from commercial sources.

The invention will be further illustrated by, but is not intended to be limited to, the following examples.

*Example I*

A photopolymerizable composition was prepared by mixing 15 g. of solution of polyethylene terephthalate/sebacate (50 mole percent) in methylene chloride (18 percent by weight solids), 2.7 g. of polyethylene glycol diacrylate (average molecular weight of 400), 0.003 g. of phenanthraquinone and 0.003 g. of p-methoxyphenol. The composition was coated to a solution depth of 10 mils on the surface of a 4-mil thick polyethylene terephthalate photographic film base support which was subcoated with vinylidene chloride/methyl acrylate/itaconic acid as disclosed in Alles et al., U.S. 2,627,088. After drying in the dark at room temperature, a 2.0-mil thick photopolymerizable film remained on the film base support. The dry surface of the film was brought into contact with a line process photographic positive and then placed in a vacuum frame. The photopolymerizable element was placed beneath a 1800-watt, high pressure mercury-arc lamp and the surface exposed to 1.75 watts of actinic radiation per square inch for 3 seconds. The element was placed, polyethylene terephthalate photographic film base support down, on the surface of a flat hot plate preheated to 120° C. After heating for 5 seconds, fine particles of zinc cadmium sulfide phosphor were sprinkled over the photopolymerized surface so that a fine film of powder covered the entire surface. The element was removed from the hot plate, was allowed to cool and the loose phosphor was brushed from the photopolymerized surface. The phosphor particles remained imbedded in the areas of the photopolymerized layer which were not exposed to actinic light. The exposed areas of the photopolymerized layer did not contain any phosphor. The dusted image was brought into intimate contact with a paper support and the element formed was heated through its polyethylene terephthalate film base support at 130 to 170° C. for about 3 seconds by means of a preheated hot plate. A good copy of the original image was obtained on the paper support. Up to 5 copies were prepared by repeating the transfer procedure using separate paper supports. The images luminesced when exposed to an ultraviolet light source.

*Example II*

A photopolymerizable composition was prepared as described in Example I except that the ethylenically unsaturated compound used was triethylene glycol diacrylate. The photopolymerizable composition was cast on a polyethylene terephthalate photographic film base support and exposed through a line process photographic positive image in a vacuum frame to actinic light as described in Example I. The element was then heated through the base support by means of a hot flat surface preheated to 120° C. After heating for 5 seconds, finely divided aluminum powder was dusted on the photopolymerized surface. The aluminum powder adhered in the areas of the photopolymerizable composition which were not exposed to actinic light to form an image.

*Example III*

The photopolymerizable composition described in Example II was coated on a 4-mil thick polyethylene terephthalate photographic film base support as described in that example. On the film surface was placed a line process photographic positive of a printed circuit and the film was exposed as described in Example I. The photopolymerized element was heated through the base support by means of a hot surface preheated to 120° C. After heating for 5 seconds finely divided copper powder was dusted on the photopolymerized surface. The powder adhered in the areas of the photopolymerized surface which were not exposed to actinic light. The dusted element, after unadhered powder was brushed off, was placed in a copper sulfate electroplating bath and copper was plated out in the areas in which the copper powder adhered to give a printed circuit.

*Example IV*

A photopolymerizable composition was prepared, cast on a polyethylene terephthalate photographic film base support and exposed to actinic light through a photographic positive as described in Example I. After heating the photopolymerized surface through the base support by means of a preheated hot plate at 40° C. a yellow image was formed by dusting Tartrazine (C.I. 19140), a yellow dye, on the heated element. A green image was obtained when Monoastral Fast Blue B (C.I. 74160) was dusted on top of the imbedded Tartrazine dye. A black image was obtained when Oil Scarlet 6G (C.I. 12140) was dusted on top of the green colored image.

*Example V*

A photopolymerizable composition was prepared, cast on a polyethylene terephthalate photographic film base support and exposed to actinic light through a photographic positive as described in Example I. A yellow dye, Tartrazine (C.I. 19140), was dusted on the heated photopolymerizable surface as described in Example IV to form a yellow image filter. The above procedure was repeated dusting Monastral Fast Blue B (C.I. 74150) on one exposed photopolymerizable film and Oil Scarlet 6G (C.I. 12140) on top of a second photopolymerizable film. The filters formed were used singly or in combination to filter out light.

*Example VI*

A photopolymerizable composition prepared as described in Example I was coated on a 4-mil thick polyethylene terephthalate photographic film base support to a dry thickness of 2 mils as described in Example I. The photopolymerizable layer was brought into contact with a photographic positive, was placed in a vacuum frame and was exposed to actinic light for 3 seconds as described in Example I. A colorless thermographic powder consisting of a mixture of 3 parts of 3-cyano-4,5-dimethyl-5-hydroxy-3-pyrrolin-2-one and 1 part of cupric acetate was dusted on the preheated photopolymerized layer as described in Example I. The powder adhered to the unexposed areas of the photopolymerizable composition. After brushing off the unadhered powder, a black image corresponding to the photographic positive was obtained by intimately contacting the dusted image surface with a paper receptor and heating to 170° C. for about 3 seconds through the film base support. Up to 4 copies were obtained, when the transfer procedure was repeated.

*Example VII*

Example I was repeated except that in place of the phosphor particles a high viscosity 99–100% hydrolyzed polyvinyl alcohol (a 4 percent water solution has a viscosity of 55–65 centipoises at 20° C.) was dusted on the pre-exposed, preheated surface. The polymeric alcohol adhered in the unexposed areas of the photopolymerizable composition forming water receptive areas. The dusted element was wet with lithographic type ink as described in Heckel U.S. Patent 1,906,961 and was brought into contact with paper receptors. Printed copies of the original image were obtained.

*Example VIII*

A photopolymerizable composition was prepared by mixing 19 g. of an aqueous solution of polyethylene oxide (molecular weight 100,000) (10% by weight of solids), 1.9 g. of polyethylene glycol diacrylate as described in Example I containing 0.002 g. of anthraquinone and 0.002 g. of p-methoxyphenol. Lead acetate (0.5 g. in 2 ml. water) was added to the photopolymerizable composition and the solution was coated to a thickness of 10 mils on a 4-mil thick polyethylene terephthalate photographic film base support as described in Example I. The coated film was allowed to dry in the dark and a 2-mil thick photopolymerizable film resulted. The film was brought into contact with a photographic positive, placed in a vacuum frame and exposed to 1.75 watts of actinic radiation per square inch for 10 seconds as described in Example I. The exposed element was heated through its polyethylene terephthalate film base support by means of a preheated hot plate at 40° C. and the heated surface was dusted thoroughly with thioacetamide. A black image formed in the unexposed areas of the photopolymerizable composition where the lead acetate and thioacetamide reacted to form lead sulfide. The access thioacetamide was brushed off the exposed surface leaving the exposed areas unchanged.

*Example IX*

A photopolymerizable composition was prepared by mixing 8 g. of low viscosity polyvinyl acetate acrylate (containing a maximum of 50 moles percent acrylyl groups) in 10 ml. of methylene chloride, 1.6 g. of triethylene glycol diacrylate, 0.002 g. of anthraquinone and 0.002 g. of p-methoxyphenol and was coated on a 4-mil thick polyethylene terephthalate photographic film base support to a dry thickness of 2 mils. On the light sensitive surface was placed a glossy, opaque, white paper with a black printed image, the image side toward the photopolymerizable surface. The element was placed in a vacuum frame and was exposed reflectively to 1.75 watts of actinic radiation per square inch for 2 seconds from the light source described in Example I through the reverse side of the film base support. A paper receptor support was heated at 60° C. on a flat preheated surface and then was brought into contact while hot for 1 second with the photopolymerizable surface. The warm surfaces were stripped apart resulting in a transfer of the unexposed areas to the paper receptor. While heating the receptor support on a flat surface preheated to 85° C., the surface was dusted with finely divided particles of carbon (particle size 73 mμ). The dusted element was allowed to cool and the excess particles were removed by brushing. The pigment particles remained imbedded in the transferred unexposed areas of the photopolymerizable composition. Multiple copies were made from the original exposed photopolymer composition by transferring thermally to a new receptor followed by dusting on of the pigment. Right-reading copies of the original image resulted.

*Example X*

A photopolymerizable composition was prepared, was cast on a polyethylene terephthalate photographic film base support and was exposed to actinic light through a photographic positive as described in Example I. The element was then heated through its base support by means of a preheated hot plate at 50° C. and the photopolymerized surface was dusted with fine particles of Tartrazine dye (C.I. 19140), a yellow dye. The dusted surface was allowed to cool and the excess dye was removed from the exposed areas of the photopolymerizable composition. The dusted photopolymerizable surface was thoroughly dampened with water and the damp surface was brought into intimate contact with a paper support at room temperature. The surfaces were separated and a yellow image was obtained on the paper receptor resulting from dye transfer from the unexposed areas.

*Example XI*

A photopolymerizable composition was prepared by mixing 12 g. of low viscosity polyvinyl acetate methacrylate (containing a maximum of 20 mole percent of methacrylyl groups), 12 ml. of ethanol, 2.54 g. of polyethylene glycol diacrylate, 0.009 g. of anthraquinone and 0.009 g. of p-methoxyphenol. The composition was coated to a wet thickness of 1 mil on three separate 4-mil thick polyethylene terephthalate photographic film base supports and the coated films were allowed to dry in the dark. Firm, dry films, 0.5 mil thick were obtained. Each film was exposed through a halftone, three color separation-positive type photographic image to 1.75 watts of actinic radiation per square inch for 10 seconds as described in Example I. The films were heated through their film base supports by means of a hot plate preheated to 60° C. After heating for 5 seconds, the surface of one exposed element was dusted with a magenta dye, Fuchsine (C.I. 42510). In like manner the other elements were dusted, one with a yellow dye, Auramine Base (C.I. 41000B) and the other with a blue-green dye, Calcocid Green S (C.I. 44090). The excess dye was brushed from the dusted surfaces as described in Example I. The magenta dusted photopolymerizable layer was brought into intimate contact with a paper support for 0.5 second and the sandwich formed was heated to 85° C. through the photopolymerizable element film base support. The magenta dusted-unexposed areas transferred to the paper support. In like manner, the blue-green and yellow dusted-unexposed areas were transferred in register to the same paper support. A three-color reproduction of the original image was formed on the paper support.

*Example XII*

A photopolymerizable composition was prepared as described in Example I and was coated on a 4-mil thick polyethylene terephthalate photographic film base support to a dry thickness of 5 mils. The photopolymerizable element was exposed to actinic light through a line process photographic positive for 3 seconds by the procedure described in Example I. The element was then placed film base support down on the surface of a flat hot plate preheated to 120° C. After heating for 5 seconds, fine particles of carbon (particle size 73 mμ) were dusted on the photopolymerized surface so that the entire surface was covered. The element was allowed to cool and the carbon particles brushed from the exposed areas of the photopolymerized surface. The dusted surface was brought into intimate contact with a paper receptor sheet and the sandwich formed was heated for 5 seconds by means of a preheated flat surface at 150° C. and separated. The unexposed areas of the photopolymerized layer transferred to the paper support to form a black relief image, 3 mils in thickness. The transferred relief was post exposed by exposing the surface to actinic light from the source described in Example I for 3 seconds. The resistant surface can then be used for relief printing.

*Example XIII*

A dye solution was prepared by mixing 6 g. of an acetone-cellulose acetate butyrate solution (20% by weight solids, the cellulose acetate butyrate containing 20% acetyl and 26% butyryl groups and has a viscosity of 56 to 131 poises determined by A.S.T.M. method D-1343-54T in the solution described as Formula A, A.S.T.M. method D-871-54T), 0.8 g. of polyethylene glycol diacrylate (average molecular weight of the diol precursor is 300), 1.5 ml. of ethanol, and 10 mg. of Calcocid Green S dissolved in 2 ml. of ethanol and 5 ml. of acetone. The photopolymerizable solution was coated on a 1.5-mil thick polyethylene terephthalate film base to a dry thickness of 0.5 mil. The coated film was brought into contact with the emulsion side of a line process photographic positive and was placed in a vacuum frame. The surface was exposed to 1.75 watts of actinic radiation per square inch for 22 seconds from a 1,800 watt, high pressure, mercury-arc lamp. After removal from the vacuum frame, the photopolymerizable element was heated at 125° C. for 5 seconds by means of a hot, flat surface and the entire surface was dusted with finely divided particles of carbon. Upon cooling to room temperature the carbon adhered to the entire surface, both exposed and unexposed. The dusted surface was brought into intimate contact with a paper support and heated at 135° C. for 10 seconds. When the two surfaces were separated a black image was obtained on the paper support corresponding to the unexposed area of the photopolymerizable composition.

The photopolymerizable compositions useful in the present invention comprise (*a*) a thermoplastic polymeric compound, (*b*) an addition polymerizable ethylenically unsaturated compound, and preferably but not necessarily, (*c*) an addition polymerization initiator, and (*d*) a thermal polymerization inhibitor.

Suitable thermoplastic polymers for component (*a*) include:

(A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters from an aforesaid glycol and (i) mixed terephthalic, isophthalic, and sebacic acids, or (ii) mixed terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methacrylate and vinylidene chloride/vinyl acetate copolymers;

(D) Ethylene/vinyl acetate copolymer;

(E) Cellulose ethers, e.g., methyl cellulose and ethyl cellulose;

(F) Polyethylene;

(G) Synthetic rubbers such as butadiene/acrylonitrile copolymers and chloro-2-butadiene-1,3 polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate, polyvinyl acetate;

(J) Polyacrylate and alpha-alkyl polyacrylate esters, e.g., polyacrylate, polymethyl methacrylate and polyethyl methacrylate;

(K) High molecular weight polyethylene oxides or polyalkylene glycols having average molecular weights from about 4,000 to 10,000 and higher;

(L) Polyvinyl chloride and copolymers, e.g., polyvinyl chloride/acetate;

(M) Polyvinyl acetals, e.g., polyvinyl butyral, polyvinyl formal;

(N) Polyformaldehydes;

(O) Polyurethanes;

(P) Polycarbonates;

(Q) Polystyrenes.

To the thermoplastic polymer constituent of the photopolymerizable composition can be added non-thermoplastic polymeric compounds to give certain desirable characteristics, e.g., to improve adhesion to the base support, adhesion to the receptor support on transfer, wear properties, chemical inertness, etc. Suitable non-thermoplastic polymeric compounds include polyvinyl alcohol, cellulose, gelatin, phenolic resins and melamine-formaldehyde resins, etc. In addition, the photopolymerizable layers can also, if desired, contain immiscible polymeric or non-polymeric organic or inorganic fillers or reinforcing agents which are essentially transparent, e.g., the organophilic silicas, bentonites, silica, powdered glass, colloidal carbon, etc., in amounts varying with the desired properties of the photopolymerizable layer. The fillers are useful in improving the strength of the composition, reducing tack and in addition, as coloring agents.

Suitable addition polymerizable ethylenically unsaturated compounds (*b*) which can be used with the above-described thermoplastic polymer compounds include, preferably an alkylene or a polyalkylene glycol diacrylate prepared from an alkylene glycol of 2 to 15 carbons or a polyalkylene ether glycol of 1 to 10 ether linkages, and those disclosed in the application of Martin and Barney, Serial No. 596,766, filed July 9, 1956, U.S. Patent 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the α-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like; unsaturated amides, particularly those of the α-methylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, di(γ-methacrylamidopropoxy)ethane, β-methacrylamidoethyl methacrylate, N-(β-hydroxyethyl)-β-(methacrylamido)ethyl acrylate and N,N-di(β-methacrylyloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal). An oustanding class of these preferred addition polymerizable components are the esters and amides of α-methylene carboxylic acids and substituted carboxylic acids with polyols and polyamines wherein the molecular chain between the hydroxyls and amino groups is solely carbon or oxygen-interrupted carbon. The preferred monomeric compounds are difunctional. The amount of monomer added varies with the particular thermoplastic polymer used.

A preferred class of addition polymerization initiators (*c*) activatable by actinic light and thermally inactive at and below 185° C. are substituted and unsubstituted polynuclear quinones, which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-pheneanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione. Other photoinitiators which are also useful include vicinal ketaldonyl compounds, such as diacetyl, benzil, etc.; α-ketaldonyl alcohols, such as benzoin, pivaloin, etc.; acyloin ethers, such as benzoin methyl or ethyl ethers, etc.; α-hydrocarbon substituted aromatic acyloins, including α-methylbenzoin, α-allylbenzoin, and α-phenylbenzoin.

Suitable thermal polymerization inhibitors (*d*) that can be used in addition to the preferred p-methoxyphenol include hydroquinone, and alkyl and aryl-substituted hydroquinones, tert-butylcatechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

The photopolymerizable composition is preferably coated on a base support. Suitable base or support materials include metals, e.g., steel and aluminum plates, sheets and foils, glass, wood paper, cloth, cellulose esters, e.g., cellulose acetate, cellulose propionate, cellulose butyrate, etc., and films or plates composed of various film-forming synthetic resins or high polymers, such as the addition polymers, including those mentioned in both monomeric and polymeric form for use in the photopolymerizable layer and in particular the vinylidene polymers, e.g., the vinyl chloride copolymers with vinyl chloride, vinyl acetate, styrene, isobutylene and acrylonitrile; the linear condensation polymers such as the polyesters, e.g., polyethylene terephthalate; the polyamides, e.g., polyhexamethylene sebacamide, polyester amides; e.g., polyhexamethylene adipamide/adipate, etc. Fillers or reinforcing agents can be present in the synthetic resin or polymer bases such as the various fibers (synthetic, modified or natural), e.g., cellulosic fibers, for instance, cotton, cellulose acetate, viscose rayon, paper; glass wool; nylon, and the like. These reinforced bases may be used in laminated form. The support may have in or on its surface and beneath the photopolymerizable stratum an antihalation layer such as is disclosed in Plambeck U.S. Patent 2,760,863.

The photopolymerizable layer is exposed to actinic radiation, generally through a process transparency, e.g., a process negative or positive (an image-bearing transparency consisting solely of substantially opaque and substantially transparent areas where the opaque areas are substantially of the same optical density, the so-called line or halftone negative or positive).

It is possible to expose through paper or other light transmitting materials. A stronger light source or longer exposure times must be used, however. Reflex exposure can also be used, e.g., in copying from paper or translucent films.

Since free-radical-generating addition-polymerization initiators activatable by actinic light generally exhibit their maximum sensitivity in the ultraviolet range, the light source should furnish an effective amount of this radiation. Such sources include carbon arcs, mercury-vapor arcs, fluorescent lamps with special ultraviolet-light-emitting phosphors, argon glow lamps, electronic flash units and photographic flood lamps. Of these, the mercury-vapor arcs, particularly the sunlamp type, and the fluorescent sunlamps, are most suitable. The sunlamp mercury-vapor arcs are customarily used at a distance of one and one-half to ten inches from the photopolymerizable layer.

After the exposure of the photopolymerizable layer, the exposed layer is heated to temperatures of 40 to 170° C. and is dusted with pigments which can be dyed or undyed, dyes, thermographic materials, color forming substances and hydrophilic and hydrophobic materials, etc. The fine particles adhere to and become imbedded in the areas of the photopolymerized layer which were not exposed to actinic light forming a direct image. Heat can be applied by means well known in the art, e.g., rollers, flat heating surfaces, radiant sources, e.g., heating lamps, etc.

Suitable pigments which can be dusted on the heated exposed surface include $TiO_2$, colloidal carbon, graphite, phosphor particles, ceramics, clays, metal powders such as aluminum, copper, magnetic iron, bronze, etc. Dyes can be used with the pigments.

Dyes of any type can be dusted or sprinkled on the exposed photopolymerizable layer. The dyes preferably melt at a higher temperature than the heat applied. Examples of useful dyes include Fuchsine (C.I. 42510), Auramine Base (C.I. 41000B), Calcocid Green S (C.I. 44090,) Para Magenta (C.I. 42500), Tryparosan (C.I. 42505), New Magenta (C.I. 42520), Acid Violet RRL (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 42600), Oil Scarlet 6G (C.I. 12140), and Monastral Blue B (C.I. 74150). Suitable combinations of the dyes may also be used.

Thermographic materials, e.g., 3-cyano-4,5-dimethyl-5-hydroxy-3-pyrrolin-2-one, etc. and activator, e.g., copper acetate, disclosed in the application of Holland et al., Serial No. 807,761, filed Apr. 21, 1959 are useful. Other thermographic materials listed in U.S. Patents 2,663,654–7 are useful.

Suitable color forming components which form colored compounds on the application of heat or when brought into contact with other color forming components include (1) Organic and inorganic components: dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) Inorganic components: ferric salts and potassium thiocyanate; ferrous salts and potassium ferricyanide; copper or silver salts and sulfide ions, lead acetate and sodium sulfide.

(3) Organic components: 2,4-dinitrophenylhydrazine and aldehydes or ketones; diazonium salt and phenol or naphthol, e.g., benzenediazonium chloride and $\beta$-naphthol; p-dimethylaminobenzaldehyde and p-diethylaminoaniline.

Examples of useful hydrophilic substances are gelatin, polyvinyl alcohol, various cellulosics and polyacrylic acid. Useful hydrophobic surfaces include polystyrene, polyethylene, rubbers, tetrafluoroethylene resin, paraffin and the polyacrylates and methacrylates.

The pigment, etc. image formed in the unexposed areas of the photopolymerized layer can be copied by bringing said surface into intimate contact with a separate receptor surface and applying heat. The receptor surface must be stable at the processing temperature. Generally the temperature is in the range of 50° to 170° C. and is applied for up to 3 seconds, preferably less. Multiple copies of the image can be made by repeating the procedure.

The receptor surface to which the image is transferred is dependent on the desired use for the transferred image and on the adhesion of the image to the base. Suitable supports include paper, cardboard, metal sheets, foils and meshes, e.g., aluminum, copper, steel, zinc, bronze, etc., wood, glass, nylon, rubber, polyethylene, linear condensation polymers such as the polyesters, e.g., polyethylene terephthalate, chromic acid treated polyethylene terephthalate, silk, cotton, viscose rayon, cellophane, cellulose esters, e.g., cellulose acetate, cellulose butyrate, etc., and other supports disclosed in Plambeck U.S. 2,791,504 (see col. 5, lines 14 to 33). The receptive support may contain on its surface chemical compounds which react with compounds being transferred so as to produce differences in color, hydrophilicity or conductivity between the exposed and the unexposed areas or for improved adhesion or brightening of the receptive support. The receptor surface may be smooth, contain roughening agents such as silica, be perforated or be in the form of a mesh or screen.

The instant invention is useful for a variety of copying, printing, decorative and manufacturing applications. Copies can be formed when the heated photopolymerized layer is dusted with finely divided dyes and pigments, the materials adhering in the unexposed areas. Multiple copies can be made by bringing into intimate contact the dusted image surface and a receptor surface and applying heat and moderate pressure. The heat transfer method is useful for making office copy and for decorative effects. Successive transfers can be made. Spirit copying matrices can be made from photopolymerizable surfaces dusted with appropriate dyes. The surface can be treated with, e.g., aqueous solutions such as ethanol, water; dyes; inks; etc. and bring said surface into intimate contact with the receptor surface. The solvents which are used for spirit copying should meter out the dye used and be a non-solvent for the polymer, i.e., the solubility of the dye and binder are important factors in selecting the solvent. When a halftone negative is used during exposure a high contrast film useful for making lithographic plates can be made by dusting on suitable carbon pigments to produce enhanced contrast.

The dusted films are useful as filters. Lithographic printing plates can be made by dusting on the unexposed areas of the photopolymerizable composition hydrophilic or hydrophobic materials depending on the type of transparency used for exposure. The process is useful in the manufacture of printed circuits and electrically conducting or photoconductive matrices. The process is also useful for making two color and multicolor reproductions and for making phosphor and ceramic patterns.

The instant process has the advantage that by an inexpensive, quick, simple procedure, involving the use of heat and light in a dry system, positive or negative type images can be prepared, said images having high contrast, good fidelity and stability. The photopolymerizable compositions used are easily altered thereby enabling the degree of tackiness after heating to be controlled. The process is very versatile, e.g., it is useful in printing such as lithographic and relief image, in making printed circuits or electrically conducting matrices and in making dye filters. When the process is used for copying, excellent copies can be obtained quickly by bringing into intimate contact with a receptor surface the dusted areas of the photopolymerizable composition and applying heat.

What is claimed is:

1. A process for forming images from a stratum which is solid below 40° C. and contains (1) underexposed, tacky image areas which are thermally transferable by having a stick or transfer temperature above 40° C. and below 220° C., comprising (*a*) a thermoplastic compound solid at 50° C. and (*b*) an ethylenically unsaturated compound containing at least one terminal ethylenic group having a boiling point above 100° C. at normal atmospheric pressure and being capable of forming a high polymer by photoinitiated addition polymerization, and (2) exposed, complementary, adjoining, non-tacky image areas solid at 50° C., not thermally transferable at said stick or transfer temperature at which the underexposed areas are thermally transferable, and comprising an addition polymer of an aforesaid ethylenically unsaturated compound and said thermoplastic compound; said process comprising (A) applying to the surface of said stratum finely divided particles of material at a tack temperature at which said particles are solid and adherent to said tacky image areas, (B) removing said particles from said non-tacky image areas, (C) placing the outer surface of said stratum having adherent, solid particles in contact with the image-receptive surface of a separate element and heating said elements while in contact to a transfer temperature of at least 40° C. to selectively soften the underexposed image areas bearing the particles, and (D) separating the two elements whereby the underexposed image areas and adherent particles are transferred to the image-receptive element.

2. A process as defined in claim 1 wherein said thermally transferable image areas contain a small amount of an addition polymerization initiator activatable by actinic light and inactive thermally below 185° C.

3. A process as defined in claim 1 wherein said thermally transferable image areas contain a small amount of an addition polymerization initiator activatable by actinic light and inactive thermally below 185° C. and a small amount of an addition polymerization inhibitor.

4. A process as defined in claim 1 wherein said particles are inert pigments.

5. A process as defined in claim 1 wherein said particles are metallic pigment particles.

6. A process as defined in claim 1 wherein said particles are phosphorescent pigment particles.

7. A process as defined in claim 1 wherein steps (A), (B) and (C) are repeated at least two times, each successive transfer in step (C) being to a different image-receptive element.

8. A process as defined in claim 1 wherein the image-receptive surface is paper.

9. A process as defined in claim 1 wherein the ethylenically unsaturated compound is a diacrylate of a diol of the formula $HO(CH_2CH_2O)_nH$ where $n$ is an integer from 1 to 20.

10. A process as defined in claim 1 wherein said particles are applied by dusting and are removed in non-tacky image areas by brushing.

11. A process as defined in claim 1 wherein the transferred images are exposed to actinic light.

12. A process which comprises (i) exposing with actinic light imagewise a photopolymerizable element bearing a stratum of photopolymerizable material, said stratum comprising (a) a thermoplastic organic polymer solid at 50° C., (b) at least one ethylenically unsaturated compound containing at least one terminal $CH_2{=}C{<}$ group having a boiling point above 100° C. at normal atmospheric pressure and being capable of forming a high polymer by photoinitiated addition polymerization, and (c) an addition polymerization initiator activatable by actinic light and thermally inactive below 185° C., said components (a) and (b) being present in amounts from 3 to 97, and 97 to 3, parts by weight, respectively, until polymerization of said unsaturated compound takes place in the exposed areas without substantial polymerization in the underexposed areas, (ii) heating the photopolymerized stratum to a tack temperature and (A) applying to the surface of the photopolymerized stratum finely divided particles of material at a tack temperature at which said particles are solid and adherent to said underexposed areas, (B) removing said particles from said non-tacky image areas, (C) placing the outer surface of said stratum having adherent, solid particles in contact with the image-receptive surface of a separate element and heating said elements while in contact to a transfer temperature of at least 40° C. to selectively soften the underexposed image areas bearing the particles, and (D) separating the two elements whereby the underexposed image areas and adherent particles are transferred to the image-receptive element.

13. A process as defined in claim 12 wherein the exposure is through an image-bearing transparency.

14. A process as defined in claim 12 wherein the exposure is through an image-bearing transparency having line and halftone images.

15. A process for forming images from a stratum which is solid below 40° C. and contains (1) underexposed, tacky image areas which are thermally transferable by having a stick or transfer temperature above 40° C. and below 220° C., comprising (a) a thermoplastic compound solid at 50° C. and (b) an ethylenically unsaturated compound containing at least one terminal ethylenic group having a boiling point above 100° C. at normal atmospheric pressure and being capable of forming a high polymer by photoinitiated addition polymerization, and (2) exposed, complementary, adjoining, non-tacky image areas solid at 50° C., not thermally transferable at said stick or transfer temperature at which the underexposed areas are thermally transferable, and comprising an addition polymer of an aforesaid ethylenically unsaturated compound and said thermoplastic compound; said process comprising (A) applying to the surface of said stratum finely divided particles of material at a tack temperature at which said particles are solid and adherent to said tacky image areas, and (B) removing said particles from said non-tacky image areas.

16. A process as defined in claim 15 wherein said particles are phosphorescent particles.

17. A process as defined in claim 15 wherein said particles are inert pigments.

18. A process as defined in claim 15 wherein said particles are metal particles.

19. A process as defined in claim 15 wherein the resulting element is plated in a plating bath.

20. A process as defined in claim 15 wherein the particles form a color when heated.

References Cited in the file of this patent

UNITED STATES PATENTS

| | | |
|---|---|---|
| 2,616,961 | Groak | Nov. 4, 1952 |
| 2,704,712 | Jackson | Mar. 22, 1955 |
| 2,756,143 | Murray | July 24, 1956 |

FOREIGN PATENTS

| | | |
|---|---|---|
| 780,218 | Great Britain | July 31, 1957 |

OTHER REFERENCES

Clerc: Photographic Theory and Practice, third ed. (1954), page 482.